United States Patent

Grossman et al.

(10) Patent No.: US 9,521,789 B2
(45) Date of Patent: Dec. 13, 2016

(54) RADIATION SHIELD STANDOFF

(71) Applicant: Honeywell International Inc., Morristown, NJ (US)

(72) Inventors: Owen D. Grossman, Golden Valley, MN (US); Dale J. Hagenson, East Bethel, MN (US); Harrison Lin, St. Paul, MN (US); Mark Lawrence Requa, III, Redington Shores, FL (US)

(73) Assignee: Honeywell International, Inc., Morris Plains, NJ (US)

( * ) Notice: Subject to any disclaimer, the term of this patent is extended or adjusted under 35 U.S.C. 154(b) by 423 days.

(21) Appl. No.: 13/888,513

(22) Filed: May 7, 2013

(65) Prior Publication Data

US 2014/0334123 A1 Nov. 13, 2014

(51) Int. Cl.
*H05K 9/00* (2006.01)
*H05K 7/14* (2006.01)

(52) U.S. Cl.
CPC ............ *H05K 9/0007* (2013.01); *H05K 7/142* (2013.01); *H05K 7/1407* (2013.01); *H05K 9/0009* (2013.01); *H05K 9/0018* (2013.01); *H05K 9/0022* (2013.01); *H05K 9/0037* (2013.01)

(58) Field of Classification Search
CPC .... H05K 7/142; H05K 9/0018; H05K 9/0037; H05K 9/1407
USPC .......................................................... 361/804
See application file for complete search history.

(56) References Cited

U.S. PATENT DOCUMENTS

| | | | |
|---|---|---|---|
| 5,754,412 | A | 5/1998 | Clavin |
| 6,226,179 | B1 | 5/2001 | Lee |
| 6,333,855 | B2 | 12/2001 | Prabaonnaud et al. |
| 6,377,445 | B1 | 4/2002 | Davis et al. |
| 6,493,233 | B1 | 12/2002 | De Lorenzo et al. |
| 7,034,223 | B2 | 4/2006 | Fan et al. |
| 8,373,999 | B1 | 2/2013 | Eifert |
| 2008/0019111 | A1 | 1/2008 | Zeng et al. |
| 2008/0089044 | A1 | 4/2008 | Fathauer et al. |

(Continued)

FOREIGN PATENT DOCUMENTS

| | | |
|---|---|---|
| CN | 202738374 | 2/2013 |
| EP | 1418798 | 5/2004 |
| JP | 2002141694 A * | 5/2002 |

OTHER PUBLICATIONS

European Patent Office, European Search Report for Application Serial No. 14165328.7, from Foreign Counterpart to U.S. Appl. No. 13/888,513, Mar. 4, 2015, pp. 1-3, Published in: EP.

(Continued)

*Primary Examiner* — Ramon M Barrera
(74) *Attorney, Agent, or Firm* — Fogg & Powers LLC

(57) ABSTRACT

A radiation shield standoff comprises a support section having a mounting surface for an electronic component, with the support section configured to separate the electronic component a predetermined distance from a chassis wall. The standoff also includes a coupling section configured to couple the standoff to the chassis wall. A flange is located between the support section and the coupling section, with the flange configured to hold a radiation shield layer in place on the chassis wall and provide radiation shielding. A boss is located between the flange and the coupling section, with the boss abutted against the flange and smaller than the flange. The standoff also comprises a radiation shielding metal.

18 Claims, 2 Drawing Sheets

(56) References Cited

U.S. PATENT DOCUMENTS

2010/0246147 A1     9/2010   Qin et al.
2013/0259601 A1*   10/2013   Letourneau ................... 411/402
2013/0322048 A1    12/2013   Wan et al.

OTHER PUBLICATIONS

European Patent Office, European Office Action for Application Serial No. 14165328.7, from Foreign Counterpart to U.S. Appl. No. 13/888,513, Mar. 18, 2015, pp. 1-11, Published in: EP.

* cited by examiner

RADIATION SHIELD STANDOFF

BACKGROUND

A standoff is typically a threaded separator of defined length used to raise one assembly above another. In electronic devices, standoffs are frequently used to raise a printed circuit board above a surface of a chassis.

Electronics for space applications may require shielding from radiation in all directions (4-pi shielding). Mounting items such as circuit boards or cards to shielded chassis walls typically requires expensive specialized hardware, including standoffs and other fastening components made of radiation shielding materials.

SUMMARY

A radiation shield standoff comprises a support section having a mounting surface for an electronic component, with the support section configured to separate the electronic component a predetermined distance from a chassis wall. The standoff also includes a coupling section configured to couple the standoff to the chassis wall. A flange is located between the support section and the coupling section, with the flange configured to hold a radiation shield layer in place on the chassis wall and provide radiation shielding. A boss is located between the flange and the coupling section, with the boss abutted against the flange and smaller than the flange. The standoff also comprises a radiation shielding metal.

BRIEF DESCRIPTION OF THE DRAWINGS

Understanding that the drawings depict only exemplary embodiments and are not therefore to be considered limiting in scope, the exemplary embodiments will be described with additional specificity and detail through the use of the accompanying drawings, in which.

DETAILED DESCRIPTION

In the following detailed description, embodiments are described in sufficient detail to enable those skilled in the art to practice the invention. It is to be understood that other embodiments may be utilized without departing from the scope of the invention. The following detailed description is, therefore, not to be taken in a limiting sense.

A radiation shield standoff is provided for mounting electronic components such as circuit boards or cards to a chassis wall. The radiation shield standoff also serves to secure a radiation shield layer to the chassis wall while preserving radiation shielding (4-pi) requirements. The radiation stand-off simplifies implementation of internal radiation shields for electronic devices used in harsh radiation environments such as outer space.

Figure 1:
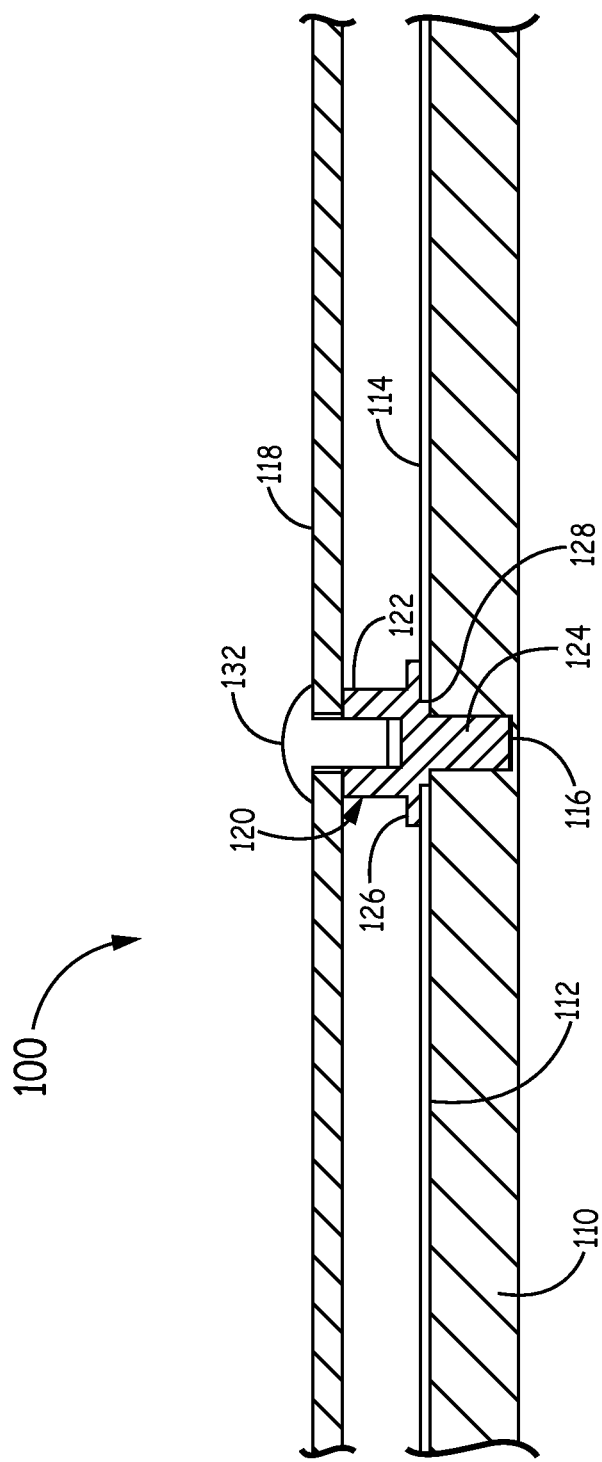
FIG. 1 is a partial side view of an electronics assembly that employs a radiation shield standoff according to one embodiment.

FIG. 1 illustrates an electronics assembly 100 that employs a radiation shield standoff 120 according to one embodiment. The electronics assembly 100 includes a chassis wall 110 having an inner surface 112 covered with a radiation shield layer 114 such as a tantalum shield. At least one threaded hole 116 is located in chassis wall 110 along inner surface 112. A circuit board 118 is separated from inner surface 112 of chassis wall 110 by standoff 120.

The standoff 120 includes a support section 122 and a coupling section 124. The support section 122 can include a hex head with a female threaded opening, and the coupling section 124 can include a male threaded protrusion. A larger flange 126 protrudes from a base of support section 122, and a smaller boss 128 is below flange 126. The flange 126 holds radiation shield layer 114 in place while preserving 4-pi radiation shielding.

The standoff 120 can be composed of a radiation shielding metal, such as tungsten, tantalum, copper, or the like.

The coupling section 124 of standoff 120 is coupled to chassis wall 110 by mating the male threaded protrusion of coupling section 124 with threaded hole 116 in chassis wall 110. The boss 128 has substantially the same height as the radiation shield layer 114. The boss 128 resides within a hole in radiation shield layer 114 that is slightly larger than boss 128. The flange 126 obscures a slight gap between boss 128 and radiation shield layer 114, thereby preserving the radiation (4-pi) coverage of shield layer 114.

The support section 122 of standoff 120 provides a mounting surface for supporting circuit board 118 at a suitable distance away from chassis wall 110. The female threaded opening in support section 122 can accept a standard screw 132 to secure circuit board 118 to standoff 120.

Although a single standoff 120 is illustrated in electronics assembly 100 of FIG. 1, it should be understood that multiple standoffs of the same construction can be employed to support one or more circuit boards in a chassis as needed.

Figure 2A:
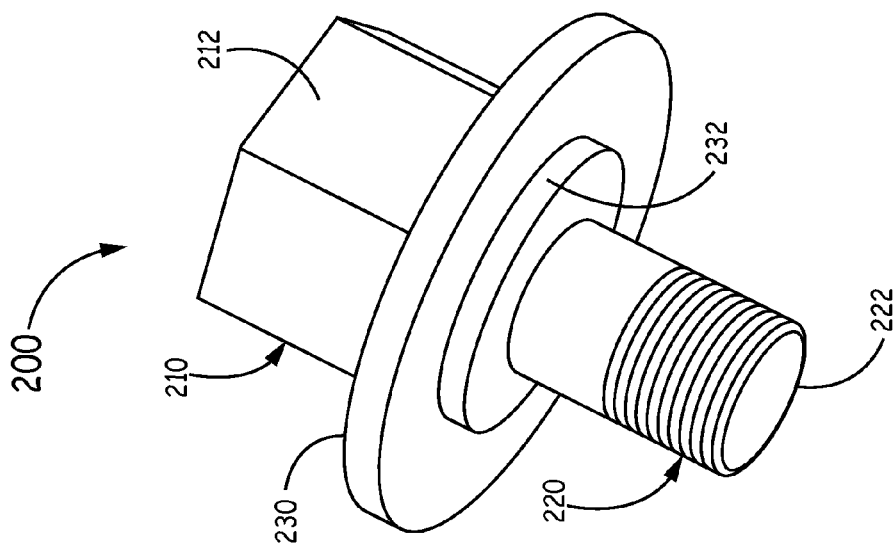
FIGS. 2A and 2B are enlarged perspective views of a radiation shield standoff that can be employed in the electronics assembly of FIG. 1.
Figure 2B:
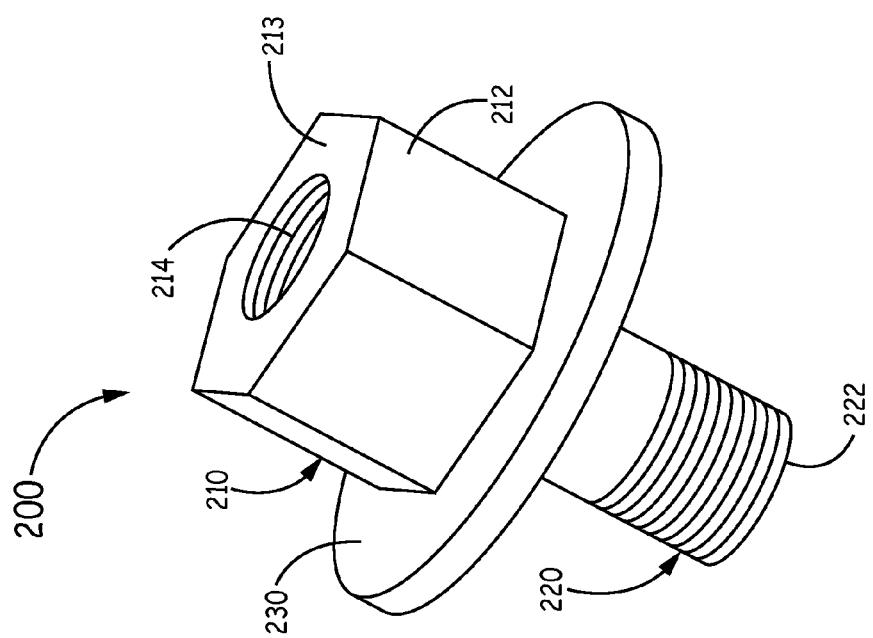

FIGS. 2A and 2B illustrate a radiation shield standoff 200 according to one embodiment, which can be employed in an electronics assembly such as shown in FIG. 1. The radiation shield standoff 200 has features similar to those of standoff 120, including a support section 210 and a coupling section 220. The support section 210 includes a hex head 212 with a mounting surface 213 and a female threaded opening 214. The support section 210 is configured to separate an electronic component a predetermined distance from a chassis wall. The coupling section 220 includes a male threaded protrusion 222, which is configured to couple standoff 200 to the chassis wall. In an alternative embodiment, coupling section 220 can have a female threaded hole in place of the male threaded protrusion.

A flange 230 is located between support section 210 and coupling section 220. The flange 230 is configured to hold a radiation shield layer in place on a chassis wall and provide radiation shielding. A boss 232 (FIG. 2B) is located between flange 230 coupling section 220, with boss 232 abutted against flange 230. The flange 230 has a circular shape defined by a perimeter with a first circumference, and boss 232 has a circular shape defined by a perimeter with a second circumference that is smaller than the first circumference of flange 230.

The standoff 200 can be composed of a radiation shielding metal such as tungsten, tantalum, copper, or the like.

Example Embodiments

Example 1 includes a radiation shield standoff comprising a support section having a mounting surface for an electronic component, the support section configured to separate the electronic component a predetermined distance from a chassis wall; a coupling section configured to couple the standoff to the chassis wall; a flange located between the support section and the coupling section, the flange configured to hold a radiation shield layer in place on the chassis wall and provide radiation shielding; and a boss located between the flange and the coupling section, the boss abutted against the flange and smaller than the flange; wherein the standoff comprises a radiation shielding metal.

Example 2 includes the radiation shield standoff of Example 1, wherein the .support section includes a hex head with a female threaded opening.

Example 3 includes the radiation shield standoff of any of Examples 1-2, wherein the coupling section includes a male threaded protrusion.

Example 4 includes the radiation shield standoff of any of Examples 1-3, wherein the coupling section includes a female threaded opening.

Example 5 includes the radiation shield standoff of any of Examples 1-4, wherein the flange has a circular shape defined by a perimeter with a first circumference.

Example 6 includes the radiation shield standoff of Example 5, wherein the boss has a circular shape defined by a perimeter with a second circumference that is smaller than the first circumference.

Example 7 includes the radiation shield standoff of any of Examples 1-6, wherein the radiation shielding metal comprises tungsten, tantalum, or copper.

Example 8 includes an electronics assembly comprising at least one chassis wall having an inner surface; a radiation shield layer over the inner surface of the chassis wall; at least one standoff coupled to the chassis wall, the standoff comprising a support section having a mounting surface and a base opposite the mounting surface, the base including a flange that holds the radiation shield layer against the inner surface of the chassis wall, wherein the standoff comprises a radiation shielding metal; and an electronic component attached to the mounting surface of the standoff and separated from the inner surface of the chassis wall by the support section of the standoff.

Example 9 includes the electronics assembly of Example 8, wherein the support section of the standoff includes a hex head with a female threaded opening mated with a screw that secures the electronic component to the standoff.

Example 10 includes the electronics assembly of any of Examples 8-9, wherein the chassis wall has at least one threaded hole along the inner surface.

Example 11 includes the electronics assembly of Example 10, wherein the standoff further comprises a coupling section with a threaded protrusion that is mated with the threaded hole in the chassis wall.

Example 12 includes the electronics assembly of any of Examples 8-11, wherein the base of the support section further comprises a boss located between the flange and the inner surface of the chassis wall.

Example 13 includes the electronics assembly of Example 12, wherein the boss is located in a hole in the radiation shield layer.

Example 14 includes the electronics assembly of any of Examples 12-13, wherein the boss has substantially the same height as the radiation shield layer.

Example 15 includes the electronics assembly of any of Examples 12-14, wherein the flange has a circular shape defined by a perimeter with a first circumference.

Example 16 includes the electronics assembly of Example 15, wherein the boss has a circular shape defined by a perimeter with a second circumference that is smaller than the first circumference.

Example 17 includes the electronics assembly of any of Examples 8-16, wherein the flange preserves a 4-pi radiation coverage of the radiation shield layer.

Example 18 includes the electronics assembly of any of Examples 8-17, wherein the radiation shield layer comprises tantalum.

Example 19 includes the electronics assembly of any of Examples 8-18, wherein the radiation shield standoff comprises tungsten, tantalum, or copper.

Example 20 includes the electronics assembly of any of Examples 8-19, wherein the electronics component comprises a circuit card or a circuit board.

The present invention may be embodied in other forms without departing from its essential characteristics. The described embodiments are to be considered in all respects only as illustrative and not restrictive. Therefore, it is intended that this invention be limited only by the claims and the equivalents thereof.

What is claimed is:

1. A radiation shield standoff assembly, comprising:
   a radiation shield layer on a chassis wall and having an opening; and
   a standoff comprising:
     a support section having a mounting surface for an electronic component, the support section configured to separate the electronic component a predetermined distance from the chassis wall;
     a coupling section configured to couple the standoff to the chassis wall;
     a flange located between the support section and the coupling section, the flange configured to hold the radiation shield layer in place on the chassis wall and provide radiation shielding; and
     a boss located between the flange and the coupling section, the boss abutted against the flange and smaller than the flange;
   wherein the boss is sized to reside within the opening in the radiation shield layer and has substantially the same height as the radiation shield layer, and the flange is sized to obscure a gap between the boss and the radiation shield layer, thereby preserving a 4-pi radiation coverage of the radiation shield layer.

2. The radiation shield standoff assembly of claim 1, wherein the support section includes a hex head with a female threaded opening.

3. The radiation shield standoff assembly of claim 1, wherein the coupling section includes a male threaded protrusion.

4. The radiation shield standoff assembly of claim 1, wherein the coupling section includes a female threaded opening.

5. The radiation shield standoff assembly of claim 1, wherein the flange has a circular shape defined by a perimeter with a first circumference.

6. The radiation shield standoff assembly of claim 5, wherein the boss has a circular shape defined by a perimeter with a second circumference that is smaller than the first circumference.

7. The radiation shield standoff assembly of claim 1, wherein the standoff comprises a radiation shielding metal comprising tungsten, tantalum, or copper.

8. The radiation shield standoff assembly of claim 1, wherein the radiation shield layer comprises tantalum.

9. An electronics assembly, comprising:
   at least one chassis wall having an inner surface;
   a radiation shield layer over the inner surface of the chassis wall;
   at least one standoff coupled to the chassis wall, the standoff comprising:
     a support section having a mounting surface;

- a coupling section that couples the standoff to the chassis wall;
- a flange located between the support section and the coupling section, the flange configured to hold the radiation shield layer against the inner surface of the chassis wall; and
- a boss located between the flange and the coupling section, the boss abutted against the flange and smaller than the flange;

an electronic component attached to the mounting surface of the standoff and separated from the inner surface of the chassis wall by the support section of the standoff;

wherein the boss is sized to reside within an opening in the radiation shield layer and has substantially the same height as the radiation shield layer, and the flange is sized to obscure a gap between the boss and the radiation shield layer, thereby preserving a 4-pi radiation coverage of the radiation shield layer.

10. The electronics assembly of claim 9, wherein the support section of the standoff includes a hex head with a female threaded opening mated with a screw that secures the electronic component to the standoff.

11. The electronics assembly of claim 9, wherein the chassis wall has at least one threaded hole along the inner surface.

12. The electronics assembly of claim 11, wherein the coupling section includes a threaded protrusion that is mated with the threaded hole in the chassis wall.

13. The electronics assembly of claim 9, wherein the boss is located between the flange and the inner surface of the chassis wall.

14. The electronics assembly of claim 13, wherein the flange has a circular shape defined by a perimeter with a first circumference.

15. The electronics assembly of claim 14, wherein the boss has a circular shape defined by a perimeter with a second circumference that is smaller than the first circumference.

16. The electronics assembly of claim 9, wherein the electronics component comprises a circuit card or a circuit board.

17. The electronics assembly of claim 9, wherein the standoff comprises a radiation shielding metal comprising tungsten, tantalum, or copper.

18. The electronics assembly of claim 9, wherein the radiation shield layer comprises tantalum.

* * * * *